(12) United States Patent
Park et al.

(10) Patent No.: US 7,737,911 B2
(45) Date of Patent: Jun. 15, 2010

(54) DISPLAY APPARATUS

(75) Inventors: Young-Joo Park, Suwon-si (KR);
Eung-Sang Lee, Seoul (KR); Jin-Hyuk Yun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 612 days.

(21) Appl. No.: 11/033,236

(22) Filed: Jan. 7, 2005

(65) Prior Publication Data

US 2005/0219150 A1    Oct. 6, 2005

(30) Foreign Application Priority Data

Jan. 9, 2004    (KR) .................... 2004-1614

(51) Int. Cl.
*G09G 5/00* (2006.01)
(52) U.S. Cl. .......................... 345/1.1; 345/1.2
(58) Field of Classification Search ........... 345/1.1–3.4
See application file for complete search history.

(56) References Cited

U.S. PATENT DOCUMENTS

| | | | |
|---|---|---|---|
| 5,737,272 A * | 4/1998 | Uchiyama et al. ........... 345/206 |
| 6,097,365 A * | 8/2000 | Makino ........................ 345/99 |
| 6,741,301 B2 * | 5/2004 | Tsuji ........................... 349/58 |
| 2003/0063041 A1 * | 4/2003 | Kurashima et al. ........... 345/1.1 |
| 2004/0021616 A1 * | 2/2004 | Goto et al. .................... 345/1.1 |
| 2004/0046705 A1 * | 3/2004 | Masazumi et al. ............. 345/1.1 |
| 2004/0075620 A1 * | 4/2004 | Tanaka et al. ................. 345/1.1 |
| 2004/0140947 A1 * | 7/2004 | Tsuyuki et al. ............... 345/1.1 |
| 2005/0146486 A1 * | 7/2005 | Lim et al. ..................... 345/1.1 |

FOREIGN PATENT DOCUMENTS

JP        2003280541        10/2003

* cited by examiner

*Primary Examiner*—Amr Awad
*Assistant Examiner*—Michael Pervan
(74) *Attorney, Agent, or Firm*—Innovation Counsel LLP

(57) ABSTRACT

A display apparatus includes first and second display panels, a driver chip and a first flexible printed circuit. The first display panel displays a first image in response to first driving signals. The second display panel displays a second image in response to second driving signals. The driver chip is disposed between the first and second display panels, and the driver chip provides the first and second driving signals to the first and second display panels. The first flexible printed circuit is disposed between the first and second display panels, and the first flexible printed circuit applies the second driving signal generated from the driver chip to the second display panel. Therefore, an electrical resistance is reduced, so that a signal delay is prevented to enhance display qualities.

30 Claims, 12 Drawing Sheets

DISPLAY APPARATUS

CROSS-REFERENCE TO RELATED APPLICATIONS

This application relies for priority upon Korean Patent Application No. 2004-1614 filed on Jan. 9, 2004, the contents of which are herein incorporated by reference in its entirety.

BACKGROUND OF THE INVENTION

1. Field of the Invention

The present invention relates to a display apparatus. More particularly, the present invention relates to a display apparatus capable of enhancing productivity and preventing a signal delay.

2. Description of the Related Art

A mobile phone includes a flip type that exposes a display panel, and a folder type of which key input part for controlling the mobile phone is combined with a display panel with a hinge.

The folder type mobile phone includes a single panel type and a dual panel type. The dual panel type mobile phone includes a main panel and a sub panel. The main panel displays main images, and the sub panel displays standby images, for example, such as time, date, etc.

The main panel is not exposed and faces the key input part, when the dual panel type mobile phone is folded. The sub panel is exposed, even when the dual panel type mobile phone is folded. Therefore, a user can perceive the standby images without opening the key input part.

Conventional main and sub panels include both a gate driver chip and a data driver chip.

However, when the main and sub panels separately include both the gate and data driver chips, a size of the display apparatus increases. Furthermore, a time for mounting the gate and data driver chips increases, and additionally, defects during manufacturing process increase to reduce productivity.

SUMMARY OF THE INVENTION

The present invention provides a display apparatus capable of enhancing productivity and preventing a signal delay.

In an exemplary display apparatus according to the present invention, the display apparatus includes a first display panel, a second display panel, a driver chip and a first flexible printed circuit. The first display panel displays a first image in response to first driving signals. The second display panel displays a second image in response to second driving signals. The driver chip is disposed between the first and second display panels, and the driver chip provides the first and second driving signals to the first and second display panels, respectively. The first flexible printed circuit is disposed between the first and second display panels, and the first flexible printed circuit applies the second driving signal generated from the driver chip to the second display panel.

In another exemplary display apparatus according to the present invention, the display apparatus includes a first display panel, a second display panel, a first flexible printed circuit and a driver chip. The first display panel displays a first image in response to a first driving signal. The second display panel displays a second image in response to a second driving signal. The first flexible printed circuit is disposed between the first and second display panels to electrically connect the first and second display panels. The driver chip is formed on the first flexible printed circuit. The driver chip applies the first and second driving signals to the first and second display panels, respectively, in response to external signals.

According to the present invention, the display apparatus includes only one driver chip. Therefore, defects of the display apparatus having one driver chip, which occur in a procedure of mounting a driver chip, are reduced in comparison with the defects of a display apparatus having two driver chips.

Furthermore, the driver chip is disposed between the main and sub panels, so that electrical paths for applying signals generated from the driver chip to the main and sub panels are shortened. Therefore, an electrical resistance is reduced, so that a signal delay is prevented to enhance display qualities.

BRIEF DESCRIPTION OF THE DRAWINGS

The above and other features and advantages of the present invention will become more apparent by describing in detailed exemplary embodiments thereof with reference to the accompanying drawings, in which.

DESCRIPTION OF EMBODIMENTS

Hereinafter the embodiments of the present invention will be described in detail with reference to the accompanied drawings.

Figure 1:
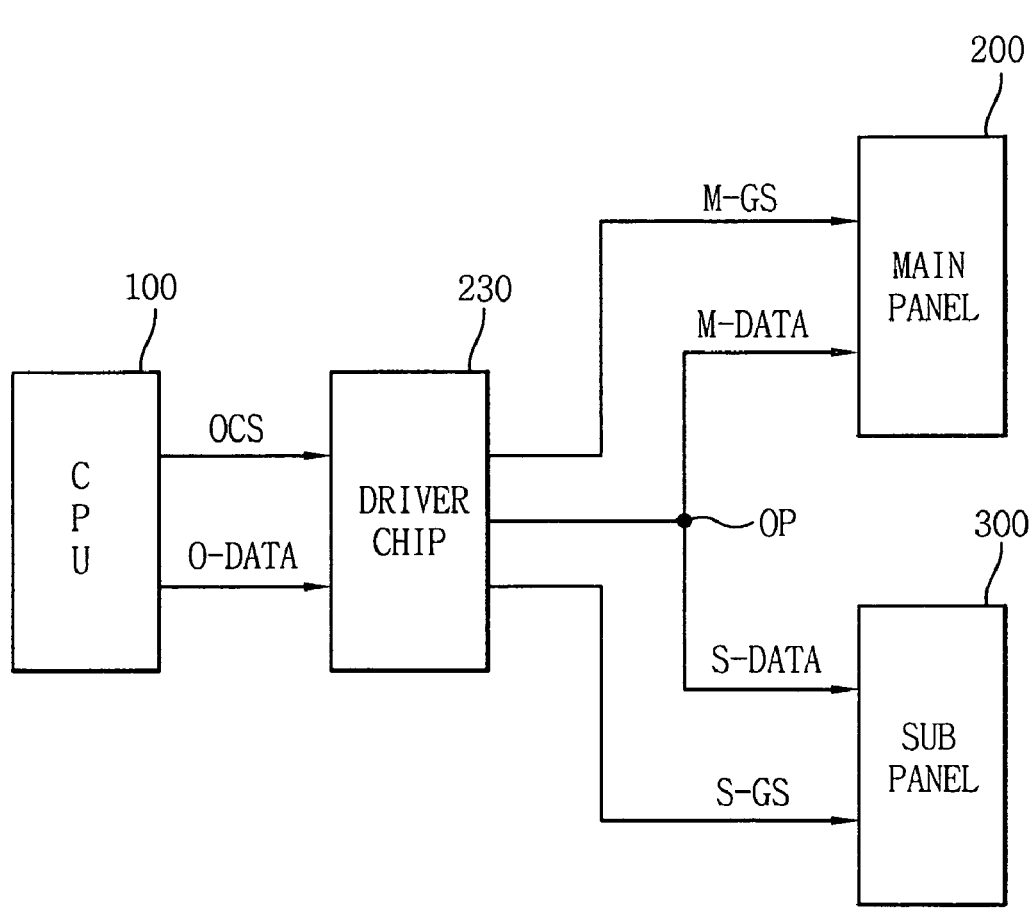
FIG. 1 is a block diagram illustrating a dual panel type liquid crystal display apparatus according to an exemplary embodiment of the present invention.

FIG. 1 is a block diagram illustrating a dual panel type liquid crystal display apparatus according to an exemplary embodiment of the present invention.

Referring to FIG. 1, a dual panel type liquid crystal display apparatus 400 according to an exemplary embodiment of the present invention includes a main panel 200, a sub panel 300 and a driver chip 230. The main panel 200 displays main images, and the sub panel 300 displays sub images. The driver chip 230 drives the main and sub panels 200 and 300.

The driver chip 230 receives a primitive image signal O-DATA and a primitive control signal OCS from an external device. As an example of the external device a central processing unit CPU 100 may be mentioned.

The driver chip 230 outputs various signals for driving the main and sub panels 200 and 300 in response to the primitive image signal O-DATA and the primitive control signal OCS. In detail, the driver chip 230 outputs a main image signal M-DATA, a sub image signal S-DATA, a main gate signal M-GS and a sub gate signal S-GS.

The main panel 200 receives the main image signal M-DATA and the main gate signal M-GS to display the main images. The sub panel 300 receives the sub image signal S-DATA and the sub gate signal S-GS to display the sub images. The main and sub image signals M-DATA and S-DATA may be outputted from a same data pad OP.

Figure 2:
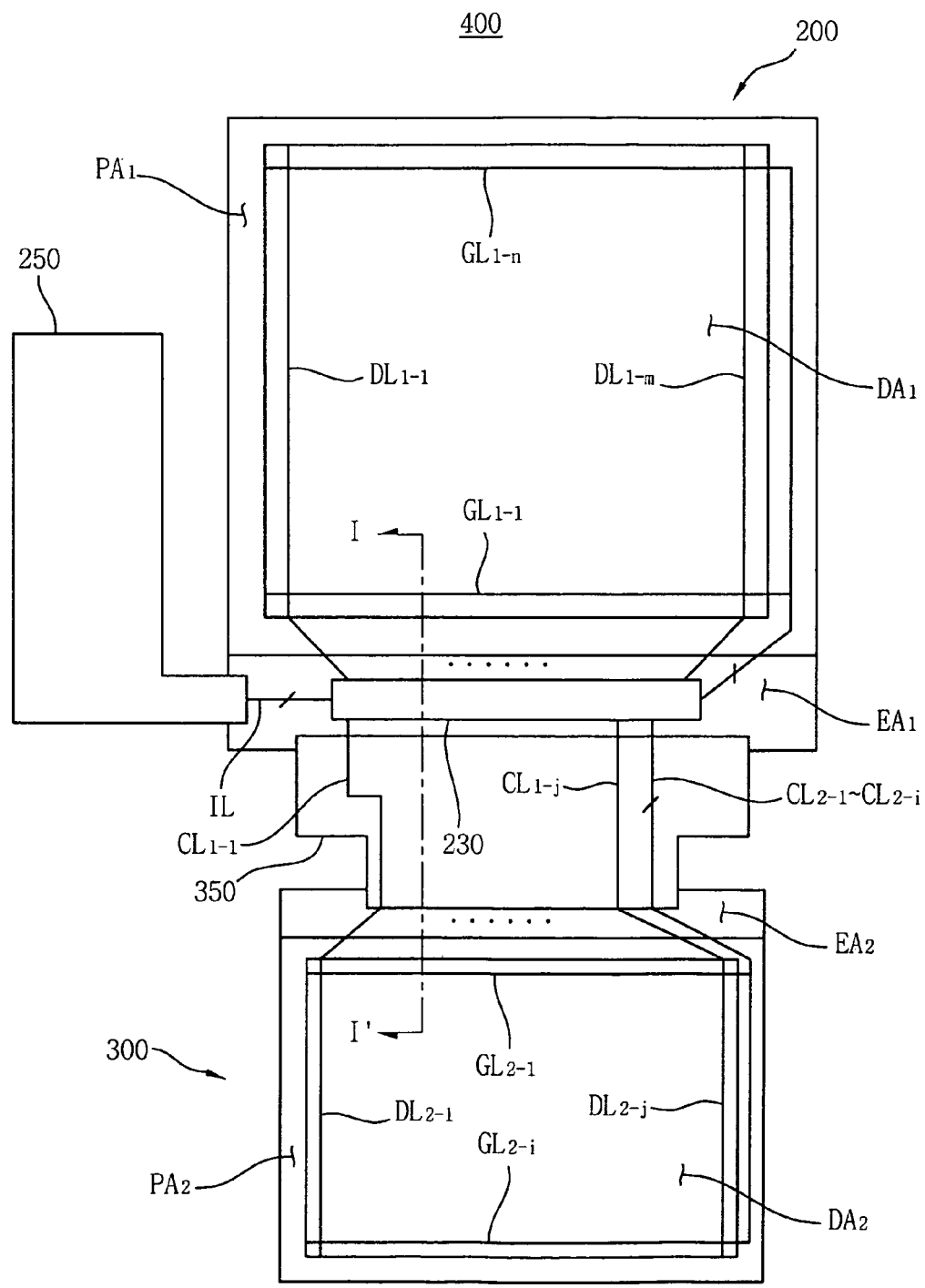
FIG. 2 is a schematic plan view illustrating the dual panel type liquid crystal display apparatus of FIG. 1.
Figure 3:
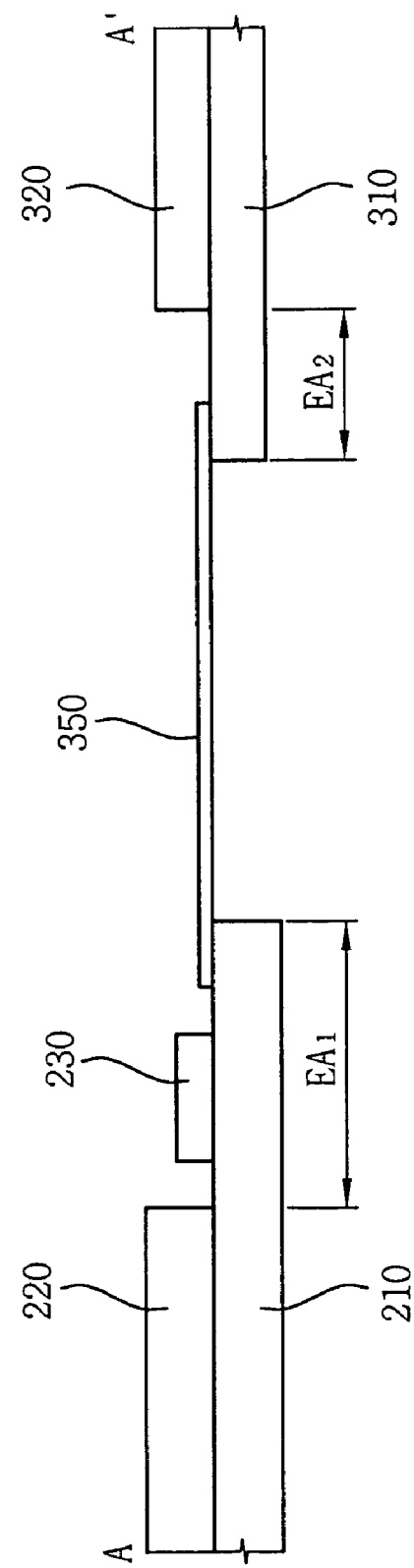
FIG. 3 is a cross-sectional view taken along a line I-I' in FIG. 2.

FIG. 2 is a schematic plan view illustrating the dual panel type liquid crystal display apparatus of FIG. 1, and FIG. 3 is a cross-sectional view taken along a line I-I' in FIG. 2.

Referring to FIG. 2, the main panel 200 includes the first display region DA1 and the first peripheral region PA1. The first display region DA1 displays the main images, and the first peripheral region PA1 is adjacent to the first display region DA1. The sub panel 300 includes the second display region DA2 and the second peripheral region PA2. The second display region DA2 displays the sub images, and the second peripheral region PA2 is adjacent to the second display region DA2.

The first display region DA1 includes a first gate line group having 'n' number of gate lines GL1-1 to GL1-$n$, and a first data line group having 'm' number of data lines DL1-1 to DL1-$m$. Each of the gate lines is perpendicular to each of data lines. The second display region DA2 includes a second gate line group having 'i' number of gate lines GL2-1 to GL2-$i$, and a second data line group having 'j' number of data lines DL2-1 to DL2-$j$. Each of the gate lines is perpendicular to each of data lines. The above values 'i' and 'n' are natural number more than one, and 'i' is no greater than 'n'. The above values 'j' and 'm' are natural number more than one, and 'j' is no greater than 'm'.

The main panel 200 is larger than the sub panel 300. Therefore, the first display region DA1 is larger than the second display region DA2. Furthermore, a resolution of the first display region DA1 is higher than a resolution of the second display region DA2.

The first peripheral region PA1 of the main panel 200 includes a first combination region EA1, and the second peripheral region PA2 of the sub panel 300 includes a second combination region EA2. The first and second peripheral regions PA1 and PA2 include first and second gate driver circuits (not shown), respectively. The first gate driver circuit applies gate signal to the main panel 200 in response to the control signal of the driver chip, and the second driver circuit applies gate signal to the sub display panel 300 in response to the control signal of the driver chip. The first and second gate driver circuit may include amorphous silicon thin film transistors.

As shown in FIG. 3, the main panel 200 includes a first lower substrate 210, a first upper substrate 220 and a first liquid crystal layer (not shown). The first lower substrate 210 and the first upper substrate 220 face each other. The first liquid crystal layer is interposed between the first lower substrate 210 and the first upper substrate 220. The sub panel 300 includes a second lower substrate 310, a second upper substrate 320 and a second liquid crystal layer (not shown). The second lower substrate 310 and the second upper substrate 320 face each other. The second liquid crystal layer is interposed between the second lower substrate 310 and the second upper substrate 320.

A first combination region EA1 corresponds to a region of the first lower substrate 210, which is not covered by the first upper substrate 220, and a second combination region EA2 corresponds to a region of the second lower substrate 310, which is not covered by the second upper substrate 320.

The driver chip 230 that drives the main and sub panels 200 and 300 is mounted on the first combination region EA1 of the first lower substrate 210. The first flexible printed circuit (FPC) 250 is attached on the first combination region EA1, and the first FPC 250 is electrically connected to the driver chip 230 via an input line IL formed on the first lower substrate 210. Therefore, the first FPC 250 applies the primitive image signal O-DATA and the primitive control signal OCS provided from the CPU 100 in FIG. 1 to the driver chip 230 via the input line IL.

The driver chip 200 and the sub panel 300 are electrically connected to each other via a second flexible printed circuit (FPC) 350. A first end of the second FPC 350 is attached to the first combination region EA1 of the main panel 200, and a second end of the second FPC 350 is attached to the second combination region EA2 of the sub panel 300.

The second FPC 350 includes a first connection line group CL1-1 to CL1-$j$ and a second connection line group CL2-1 to CL2-$i$. The first connection line group CL1-1 to CL1-$j$ electrically connects the second data line group DL2-1 to DL2-$j$ to the driver chip 230. The second connection line group CL2-1 to CL2-$i$ electrically connects the second gate line group GL2-1 to GL2-$l$ to the driver chip 230. Therefore, even when the driver chip 230 is mounted on the first connection region EA1 of the main panel 200, the driver chip 230 can drive the sub panel 300.

The sub image signal S-DATA outputted from the driver chip 230 is transferred to the second data line group DL2-1 to DL2-$j$ of the sub panel 300 via the first connection line group CL1-1 to CL1-$j$. The sub gate signal S-GS outputted from the driver chip 230 is transferred to the second gate line group GL2-1 to GL2-$l$ of the sub panel 300 via the second connection line group CL2-1 to CL2-$i$.

As described above, even when the driver chip 230 is mounted on the main panel 200, a path for transferring the sub image signal S-DATA and S-GS outputted from the driver chip 230 is reduced, because the driver chip is mounted on a region of the main panel 200, which is adjacent to the sub panel 300. Therefore, the sub image signal S-DATA and the sub gate signal S-GS are not delayed.

Figure 4:
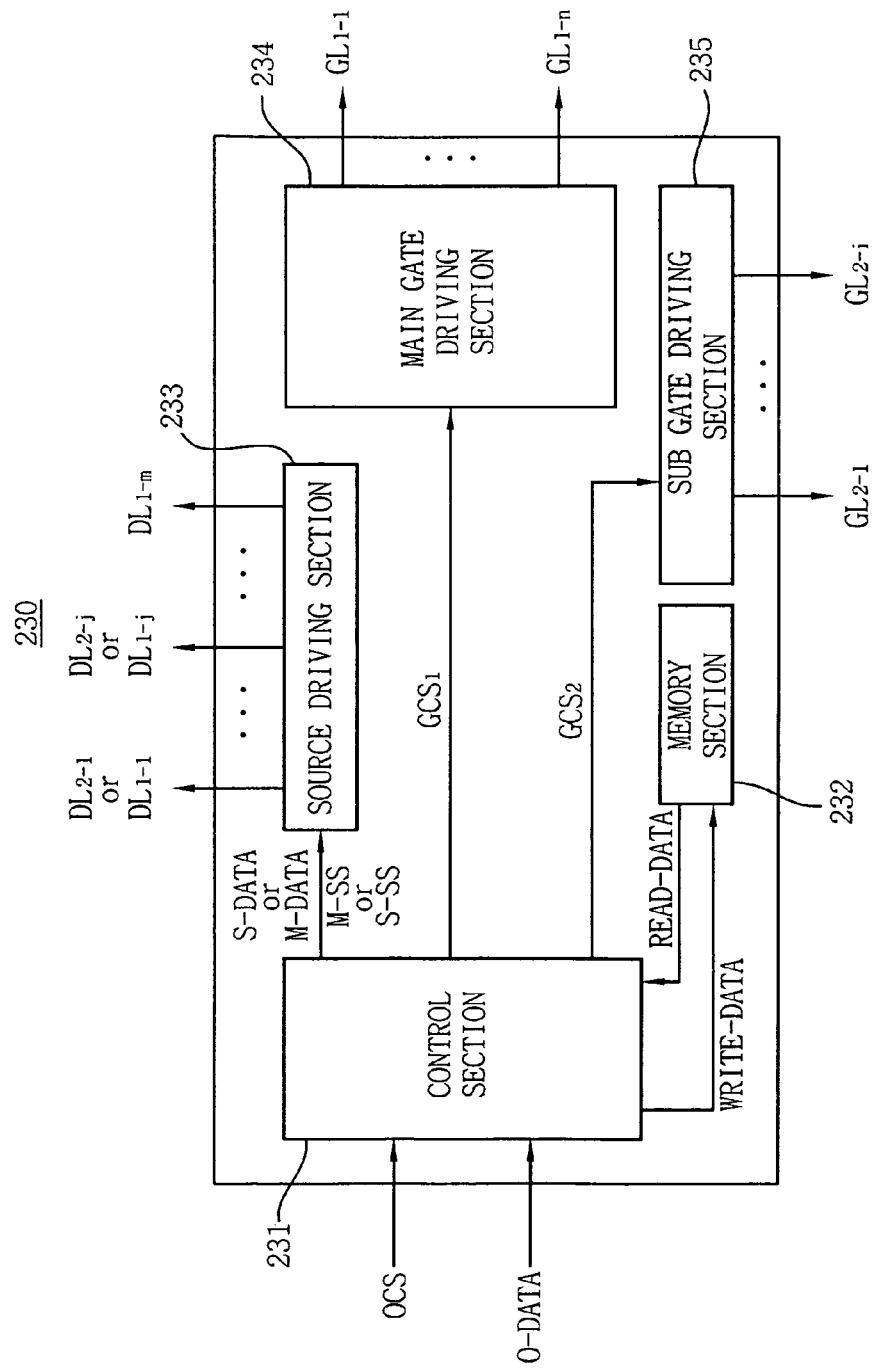
FIG. 4 is a block diagram illustrating a driver chip in FIG. 2.

FIG. 4 is a block diagram illustrating a driver chip in FIG. 2.

Referring to FIG. 4, the driver chip 230 includes a control section 231, a memory section 232, a source driving section 233, a main gate driving section 234 and a sub gate driving section 235.

The control section 231 receives the primitive image signal O-DATA and the primitive control signal OCS from the CPU 100 in FIG. 1.

The control section 231 provides the memory section 232 with the primitive image signal O-DATA provided from the CPU, so that the memory section 232 stores the primitive image signal O-DATA (WRITE DATA process). Then, the control section 231 read the primitive image signal O-DATA line by line in response to the primitive control signal OCS (READ DATA process).

The memory section 232 includes a main storing region and a sub storing region, and the main storing region and the sub storing region store the primitive image signal O-DATA, selectively.

The control section 231 reads a main image signal M-DATA that is stored in the main storing region of the memory section 232, and the control section 231 provides the source driving section 233 with the main image signal M-DATA and a main selection signal M-SS. The source driving section 233 applies the main image signal M-DATA to the first data lines DL1-1 to DL1-m of the main panel 200 in response to the main selection signal M-SS.

Furthermore, the control section 231 reads a sub image signal S-DATA that is stored in the sub storing region of the memory section 232, and the control section 231 provides the source driving section 233 with the sub image signal S-DATA and a sub selection signal S-SS. The source driving section 233 applies the sub image signal S-DATA to the second data lines DL2-1 to DL2-j of the main panel 200 in response to the sub selection signal S-SS.

The main gate driving section 234 receives a first gate control signal GCS1, and the main gate driving section 234 applies the main gate signal M-GS in FIG. 1 to the first gate lines GL1-1 to GL1-n of the main panel 200.

The sub gate driving section 235 receives a second gate control signal GCS2, and the sub gate driving section 235 applies the sub gate signal S-GS in FIG. 1 to the second gate lines GL2-1 to GL2-i of the sub panel 300.

In FIGS. 1 to 4, the driver chip 230 includes both the main and sub gate driving sections 234 and 235.

However, the main and sub gate driving sections 234 and 235 may be separated from the driver chip 230. That is, the main and sub gate driving sections 234 and 235 may be formed on the main and sub panels 200 and 300, respectively. In detail, the main gate driving section 234 may be formed in the first peripheral region PA1 of the main panel 200 to apply the main gate signal M-GS to the first gate line group GL1-1 to GL1-n, and the sub gate driving section 235 may be formed in the second peripheral region PA2 of the sub panel 300 to apply the sub gate signal S-GS to the second gate line group GL2-1 to GL2-i.

The dual panel type liquid crystal display apparatus 400 of FIGS. 2 and 3 includes only one gate driving section 234 that applies the gate signal to the first gate line group GL1-1 to GL1-n formed on the main panel 200. However, the dual panel type liquid crystal display apparatus 400 may include an odd gate driving section that applies the gate signal to odd numbered gate lines, and an even gate driving section that applies the gate signal to even numbered gate lines.

Figure 5:
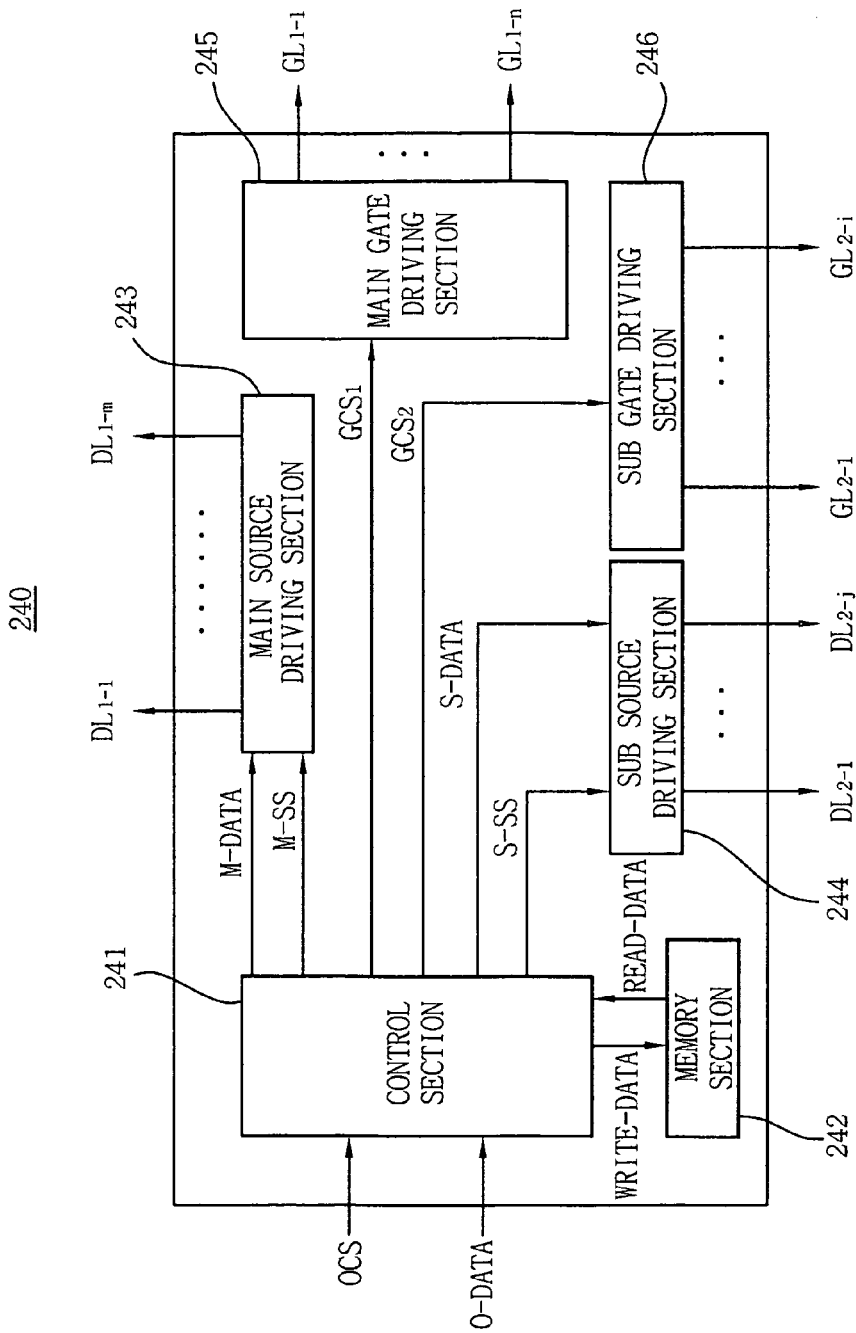
FIG. 5 is a block diagram illustrating a driver chip according to another exemplary embodiment of the present invention.

FIG. 5 is a block diagram illustrating a driver chip according to another exemplary embodiment of the present invention.

Referring to FIG. 5, a driver chip 240 according to another exemplary embodiment of the present invention includes a control section 241, a memory section 242, a main source driving section 243, a sub source driving section 244, a main gate driving section 245 and a sub gate driving section 246.

The control section 241 reads the main-image signal M-DATA stored in the main storing region of the memory section 242, and the control section 241 provides the main image signal M-DATA and the main selection signal M-SS to the main source driving section 243 to drive the main panel 200. The main source driving section 243 outputs the main image signal M-DATA to the first data lines DL1-1 to DL1-m of the main panel 200 in response to the main selection signal M-SS.

Additionally, the control section 241 reads the sub-image signal S-DATA stored in the sub storing region of the memory section 242, and the control section 241 provides the sub image signal S-DATA and the sub selection signal S-SS to the sub source driving section 244 to drive the sub panel 300. The sub source driving section 244 outputs the sub image signal S-DATA to the second data lines DL2-1 to DL2-j of the main panel 200 in response to the sub selection signal S-SS.

Figure 6:
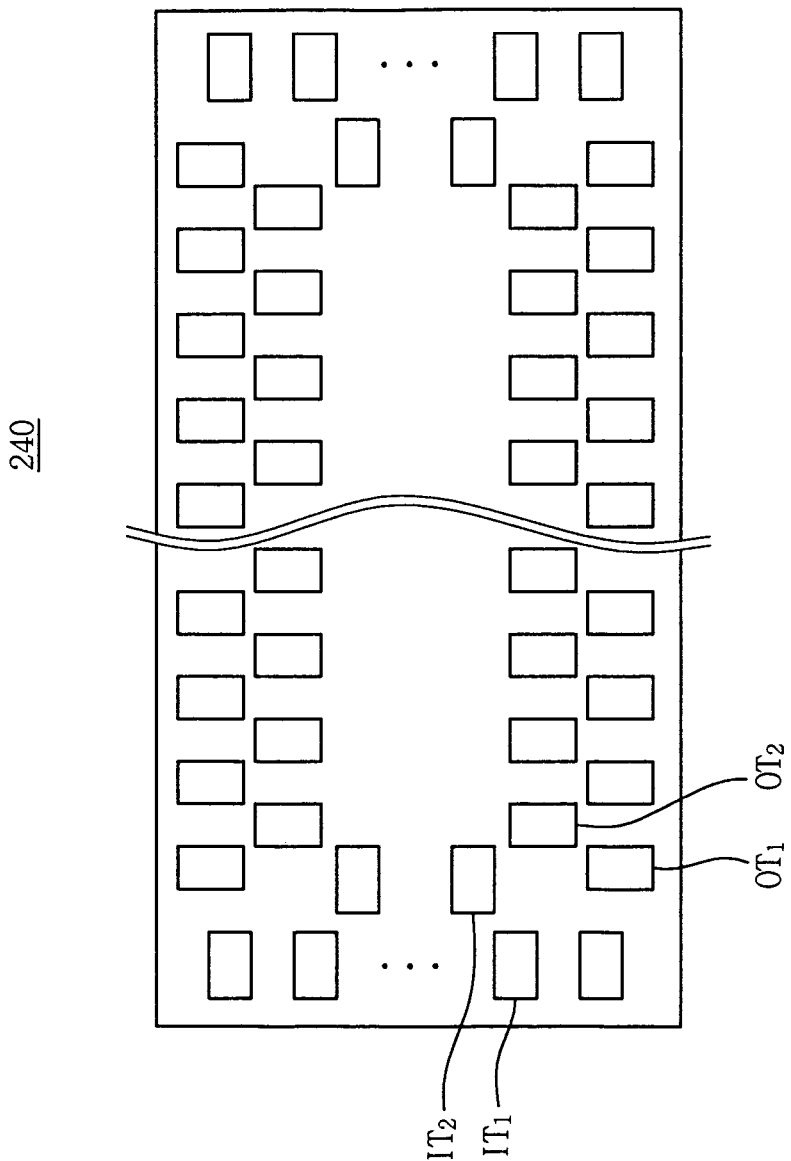
FIG. 6 is a bottom view illustrating the driver chip of FIG. 5.

FIG. 6 is a bottom view illustrating the driver chip of FIG. 5.

Referring to FIG. 6, a plurality of first and second input terminals IT1 and IT2 are formed on a backside of the driver chip 240. Additionally, a plurality of first and second output terminals OT1 and OT2 are formed on the backside of the driver chip 240.

The first input terminals IT1 and the first output terminals OT1 are formed on an edge region of the driver chip 230. The second input terminals IT2 and the second output terminals OT2 are formed on a region surrounded by the first input terminals IT1 and the first output terminals OT1. The second input terminals IT2 and the second output terminals OT2 may alternate with the first input terminal IT1 and the first output terminal OT1, respectively. Furthermore, a portion of the second input terminals IT2 and the second output terminals OT2 may be disposed between the first input terminal IT1 and the first output terminal OT1, respectively.

Figure 7:
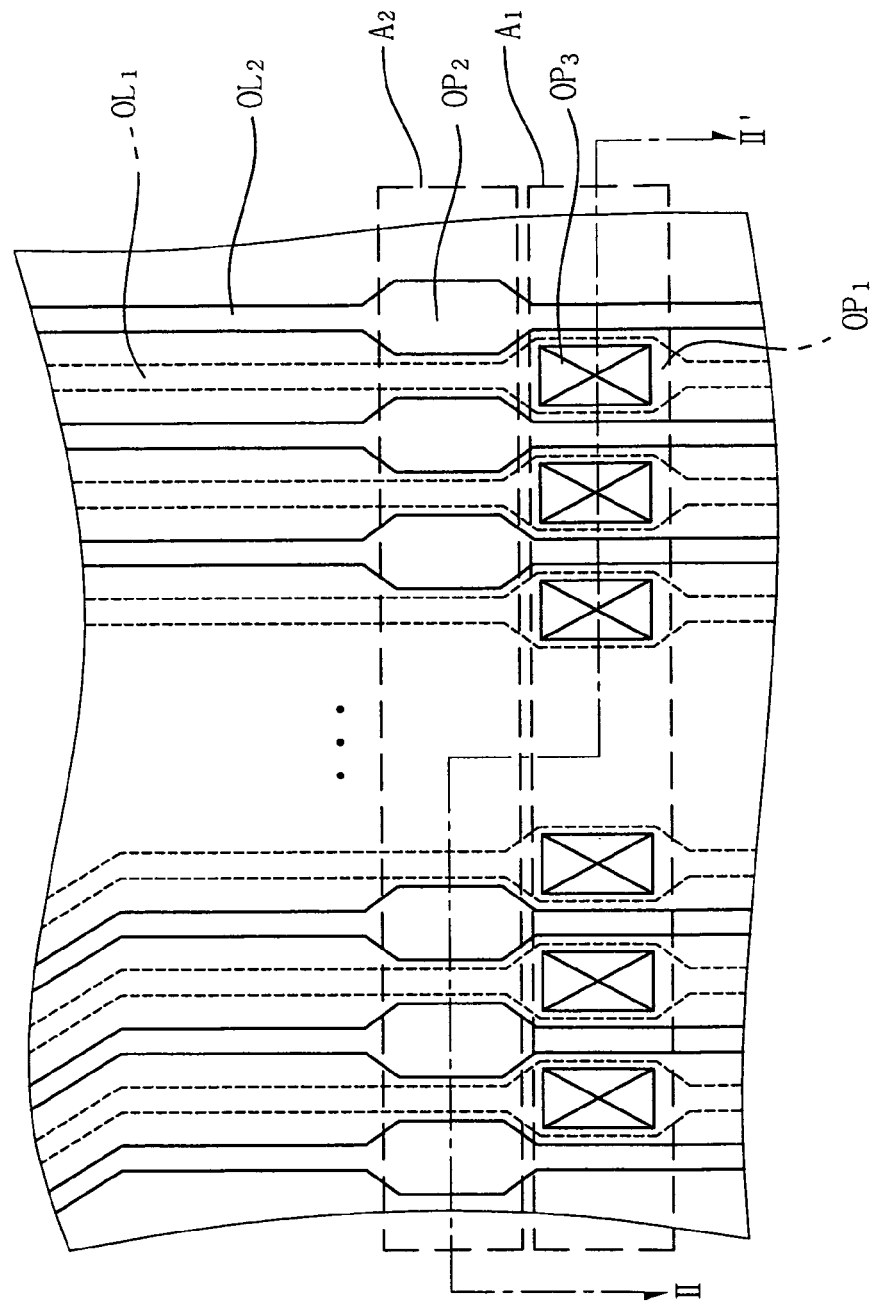
FIG. 7 is a schematic plan view illustrating a first combination region of a first lower substrate.
Figure 8:
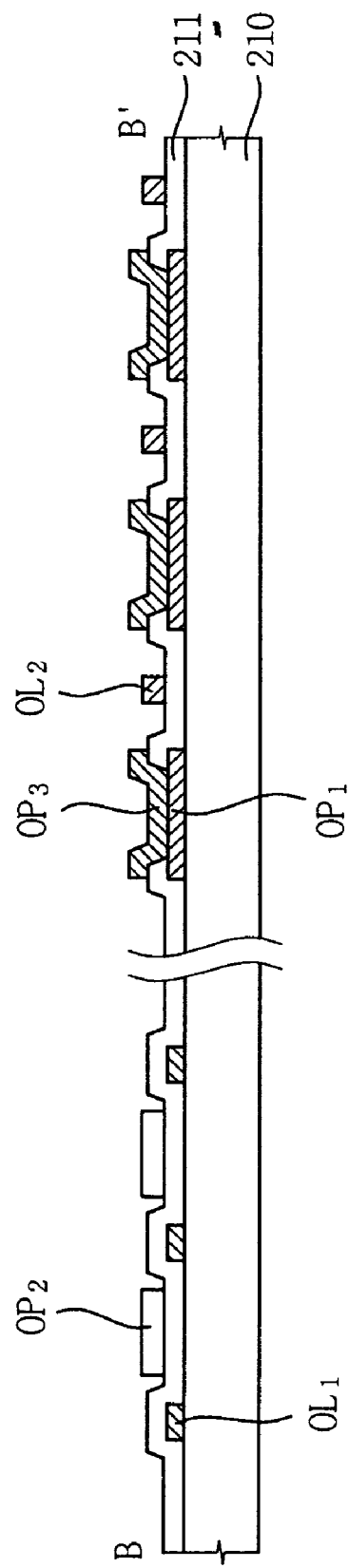
FIG. 8 is a cross-sectional view taken along a line II-II' in FIG. 7.

FIG. 7 is a schematic plan view illustrating a first combination region of a first lower substrate, and FIG. 8 is a cross-sectional view taken along a line II-II' in FIG. 7.

Referring to FIGS. 7 and 8, first output lines OL1 and second output lines OL2 are disposed on the first lower substrate 210. In detail, the first output lines OL1 and the second output lines OL2 are disposed at different layers.

The first and second output lines OL1 and OL2 electrically connect the driver chip 240 of FIG. 5 to the first data line group DL1-1 to DL1-m, the first gate line group GL1-1 to GL1-n, the first connection line group CL1-1 to CL1-j and the second connection line group CL2-1 to CL2-i in FIG. 2.

Each line width of the first output lines OL1 is increased at a first region A1 to form a first output pad OP1 that is electrically connected to the second output terminals OT2 of the driver chip 240 in FIG. 6.

A gate insulation layer 211 is formed on the first lower substrate 210, such that the gate insulation layer 211 covers the first output lines OL1 and the gate insulation layer 211 exposes the first output pad OP1. The second output lines OL2 are formed on the gate insulation layer 211.

Each of the second output lines OL2 is disposed between the first output lines OL1. Each line width of the second output lines OL2 is increased at a second region A2 to form a second output pad OP2 that is electrically connected to the first output terminals OT1 of the driver chip 240 in FIG. 6.

A third output pad OP3 is disposed on the first output pad OP1, such that the third output pad OP3 is electrically connected to the output pad OP1. The third output pad OP3 is directly connected to the second output terminal OT2, so that the first output pad OP1 is electrically connected to the second output terminal OT2.

As shown in FIGS. 6 to 8, the first and second output terminals OT1 and OT2 are arranged in two lines. Therefore, a size of the driver chip 240, which is proportional to a number of the output terminals, may be reduced. Furthermore, the first and second output lines OL1 and OL2 are formed on different layers of the first lower substrate 210. Therefore, a size of the first lower substrate 210 may be reduced.

Figure 9:
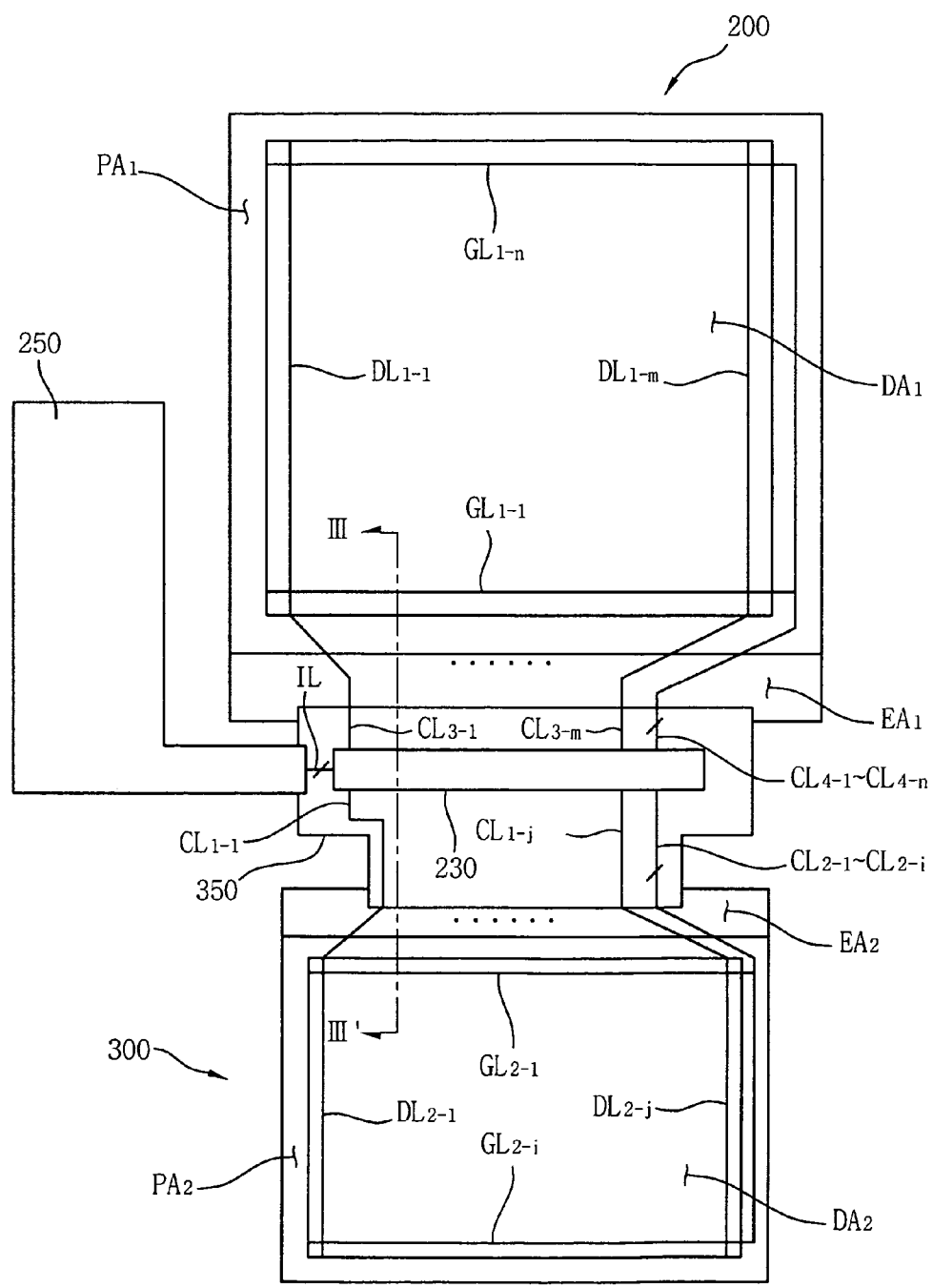
FIG. 9 is a schematic plan view illustrating a dual panel type liquid crystal display apparatus according to another exemplary embodiment of the present invention.
Figure 10:
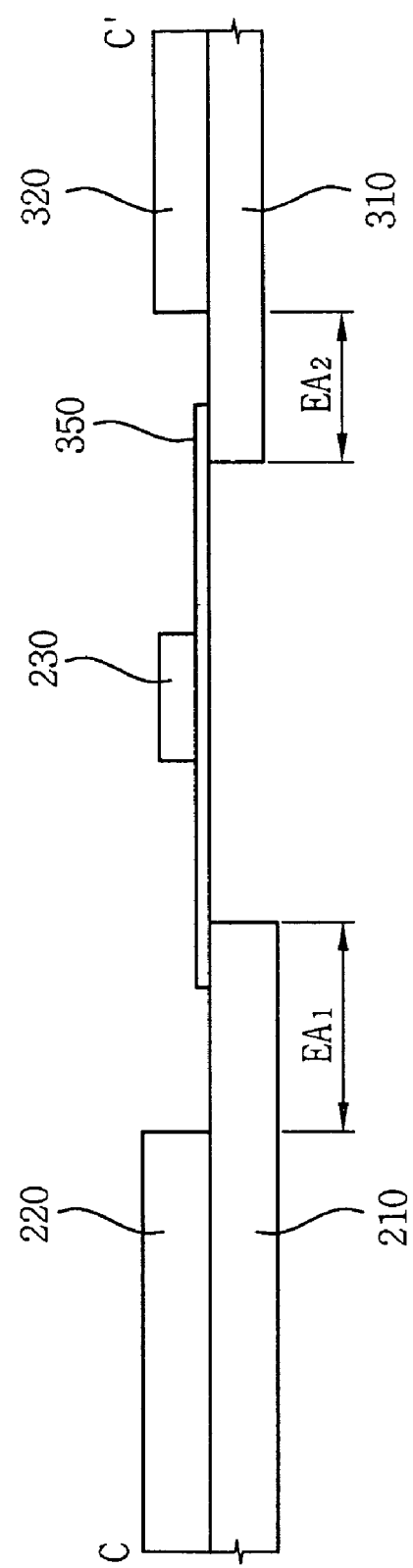
FIG. 10 is a cross-sectional view taken along a line III-III' in FIG. 9.

FIG. 9 is a schematic plan view illustrating a dual panel type liquid crystal display apparatus according to another exemplary embodiment of the present invention, and FIG. 10 is a cross-sectional view taken along a line III-III' in FIG. 9. In FIGS. 9 and 10, the same reference numerals denote the same elements in FIGS. 2 and 3, and thus the detailed descriptions of the same elements will be omitted.

Referring to FIG. 9, a main panel 200 includes a first display region DA1 that displays main images, and a first peripheral region PA1 that is adjacent to the first display region DA1. A sub panel 300 includes a second display region DA2 that displays sub images, and a second peripheral region PA2 that is adjacent to the second display region DA2.

The first peripheral region of the main panel 200 includes a first connection region EA1, and the second peripheral region of the sub panel 300 includes a second connection region EA2. The first connection region EA1 corresponds to a region of a first lower substrate 210 that is not covered by a first upper substrate 220, and the second connection region EA2 corresponds to a region of a second lower substrate 310 that is not covered by a second upper substrate 320.

A first end of the second flexible printed circuit (FPC) 350 is attached to the first connection region EA1, and a second end of the second FCP 350 is attached to the second connection region EA2. A driver chip 230 for driving the main and sub panels 200 and 300 is mounted on the second FPC 350.

The second FPC 350 includes a first connection line group CL1-1 to CL1-$j$ and a second connection line group CL2-1 to CL2-$i$. The first connection line group CL1-1 to CL1-$j$ electrically connects the driver chip 230 to a second data line group DL2-1 to DL2-$j$, and the second connection line group CL2-1 to CL2-$i$ electrically connects the driver chip 230 to a second gate line group GL2-1 to GL2-$i$. Additionally, the second FPC 350 includes a third connection line group CL3-1 to CL3-$m$ and a fourth connection line group CL4-1 to CL4-$n$. The third connection line group CL3-1 to CL3-$m$ electrically connects the driver chip 230 to a first data line group DL1-1 to DL1-$m$, and the fourth connection line group CL4-1 to CL4-$n$ electrically connects the driver chip 230 to a first gate line group GL1-1 to GL1-$n$.

The sub image signal S-DATA in FIG. 4 outputted from the driver chip 230 is transferred to the second data line group DL2-1 to DL2-$j$ via the first connection line group CL1-1 to CL1-$j$. Additionally, the sub gate signal S-GS in FIG. 4 outputted from the driver chip 230 is transferred to the second gate line group GL2-1 to GL2-$i$ via the second connection line group CL2-1 to CL2-$i$.

The main image signal M-DATA in FIG. 4 outputted from the driver chip 230 is transferred to the first data line group DL1-1 to DL1-$m$ via the third connection line group CL3-1 to CL3-$m$. Additionally, the main gate signal M-GS in FIG. 4 outputted from the driver chip 230 is transferred to the first gate line group GL1-1 to GL1-$n$ via the fourth connection line group CL4-1 to CL4-$n$.

Therefore, even when the driver chip 230 is mounted on the second FPC 350, the driver chip 230 can drive the main and sub panels 200 and 300.

The second FPC 350 is combined to the first FPC 250, and the second FPC 350 includes an input line IL that is electrically connected to the driver chip 230. The first FPC 250 provides a primitive image signal O-DATA and a primitive control signal OCS outputted from the CPU 100 in FIG. 1 to the input line IL. Therefore, the driver chip 230 receives the primitive image signal O-DATA and the primitive control signal OCS.

According to the present embodiment, the driver chip 230 is mounted on the second FPC 350, so that the path, through which signal is applied to the sub panel, is reduced. Therefore, the sub image signal S-DATA and the sub gate signal S-GS are applied to the sub panel 300 without delay.

Figure 11:
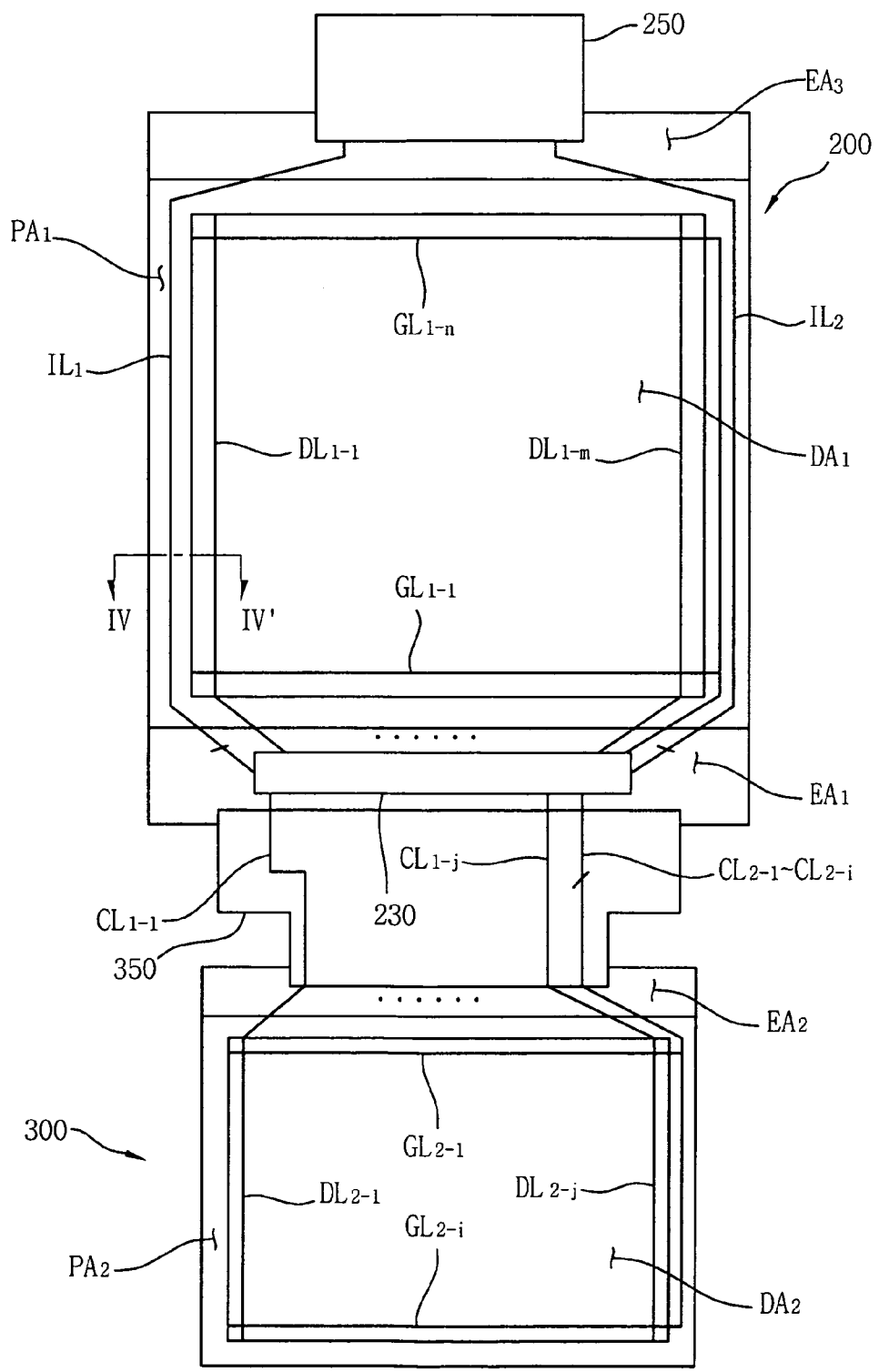
FIG. 11 is a schematic plan view illustrating a dual panel type liquid crystal display apparatus according to another exemplary embodiment of the present invention.
Figure 12:
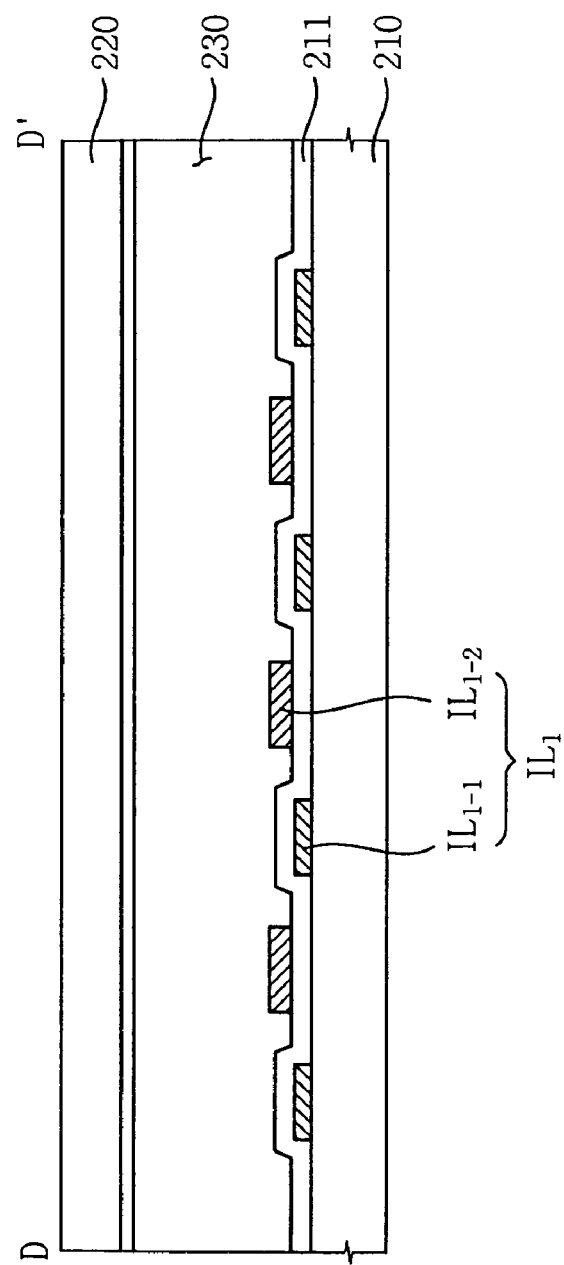
FIG. 12 is a cross-sectional view taken along a line IV-IV' in FIG. 11.

FIG. 11 is a schematic plan view illustrating a dual panel type liquid crystal display apparatus according to another exemplary embodiment of the present invention, and FIG. 12 is a cross-sectional view taken along a line IV-IV' in FIG. 11. In FIGS. 11 and 12, the same reference numerals denote the same elements in FIG. 2, and thus the detailed descriptions of the same elements will be omitted.

Referring to FIG. 11, a main panel 200 includes a first display region DA1 that displays main images, and a first peripheral region PA1 that is adjacent to the first display region DA1. The first peripheral region PA1 includes a first and third connection regions EA1 and EA3. The first connection region EA1 is formed on a first end portion of the first lower substrate 210, which is not covered by the first upper substrate 220, and the third connection region EA3 is formed on a second end portion of the first lower substrate, which is also not covered by the first upper substrate 220.

The sub panel 300 includes a second display region DA2 that displays standby images, and a second peripheral region PA2 that is adjacent to the second display region DA2. The second peripheral region PA2 includes a second combination region EA2. The second combination region EA2 is formed on an end portion of a second lower substrate 310, which is not covered by a second upper substrate.

The first FPC 250 is attached to the third connection region EA3 of the main panel 200, and the driver chip 230 is mounted on the first connection region EA1 of the main panel 200. The first peripheral region PA1 includes first and second input line groups IL1 and IL2 that electrically connect the first FPC to the driver chip 230. The first and second input line groups IL1 and IL2 are extended from the third connection region EA3 to the first connection region EA1.

Therefore, the first and second input line groups IL1 and IL2 of the first FPC 250 transfer the primitive image signal O-DATA and the primitive control signal OCS in FIG. 1, which are provided from the CPU in FIG. 1, to the driver chip 230.

Referring to FIG. 12, the first input line group IL1 includes first and second input lines IL1-1 and IL1-2 that are disposed on different layer. The first input lines IL1-1 are formed on a same layer as the first gate lines GL1-1 to GL1-$n$, and the second input lines IL-2 are formed on a same layer as the first data line group DL1-1 to DL1-$n$ that formed on a gate insulation layer 211.

When the first and second input lines IL1-1 to IL1-2 are formed at different layers, a distance between the lines may be reduced in comparison that the first and second input lines IL1-1 to IL1-2 are formed on a same layer. Therefore, even when the first input line group IL1 are formed at the first peripheral region PA1, a width of the first peripheral region may be reduced.

The second FPC 350 is attached at the first and second connection regions EA1 and EA2 to electrically connect the driver chip 230 to the sub panel 300. Therefore, the driver chip 230 drives both the main panel 200 and the sub panel 300.

According to the present embodiment, the driver chip outputs the first and second driving signals, the main panel displays main images in response to the first driving signal, and the sub panel displays standby images in response to the second driving signal. The driver chip is disposed between the main and sub panels.

The display apparatus includes only one driver chip. Therefore, defects of the display apparatus having one driver chip, which occur in a procedure of mounting a driver chip, are reduced in comparison with the defects of a display apparatus having two driver chips.

Furthermore, the driver chip is disposed between the main and sub panels, so that the electrical paths for applying signals generated from the driver chip to the main and sub panels are reduced. Therefore, an electrical resistance is reduced, so that a signal delay is prevented to enhance display qualities.

Having described the exemplary embodiments of the present invention and its advantages, it is noted that various changes, substitutions and alterations can be made herein without departing from the spirit and scope of the invention as defined by appended claims.

What is claimed is:

1. A display apparatus comprising:
a first display panel that displays a first image in response to a first driving signal;
a second display panel that displays a second image in response to a second driving signal;
a driver chip disposed on the first display panel the driver chip providing the first and second driving signals to the first and second display panels, respectively;
a first flexible printed circuit disposed between the first and second display panels, the first flexible printed circuit applying the second driving signal generated from the driver chip to the second display panel;
first output lines formed on the first display panel;
an insulation layer formed on the first output lines; and
second output lines disposed on the insulating layer, wherein the first output lines extend to first output pads, the second output lines extend to second output pads, and the first output pads are electrically connected to the driver chip through third output pads disposed on the first output pads.

2. The display apparatus of claim 1, wherein the first and second driving signals are outputted from a same pad.

3. The display apparatus of claim 1, further comprising:
a first gate driver circuit that applies a first scan signal to the first display panel in response to a first control signal of the driver chip, the first gate driver circuit being disposed in a first peripheral region of the first display panel; and
a second gate driver circuit that applies a second scan signal to the second display panel in response to a second control signal of the driver chip, the second gate driver circuit being disposed in a second peripheral region of the second display panel.

4. The display apparatus of claim 3, wherein the first and second gate driver circuits include amorphous silicon thin film transistor.

5. The display apparatus of claim 1, further comprising a second flexible printed circuit attached at the first display panel, the second flexible printed circuit receiving external signals to provide the driver chip with the external signals.

6. The display apparatus of claim 5, wherein the first display panel comprises a first lower substrate and a first upper substrate that faces the first lower substrate, and the second display panel comprises a second lower substrate and a second upper substrate that faces the second lower substrate.

7. The display apparatus of claim 6, wherein the driver chip is formed on a first combination region of the first lower substrate, the first combination region being exposed out of the first upper substrate.

8. The display apparatus of claim 7, wherein the second flexible printed circuit is attached at the first combination region, and the second flexible printed circuit is electrically connected to the driver chip.

9. The display apparatus of claim 7, wherein a first end portion of the first flexible printed circuit is attached at the first combination region, and a second end portion of the first flexible printed circuit is attached at a second combination region of a second lower substrate of the second display panel, which corresponds to a region exposed out of a second upper substrate.

10. The display apparatus of claim 7, wherein the second flexible printed circuit is attached at a third combination region formed on the first lower substrate, the third combination region being disposed opposite to the first combination region, and the third combination region being exposed out of the first upper substrate.

11. The display apparatus of claim 10, wherein the first display panel comprises an input line group transferring the external signals from the second flexible printed circuit to the driver chip.

12. The display apparatus of claim 6, wherein the first output lines are disposed on the first lower substrate and the second output lines are disposed on a gate insulation layer that covers the first output lines and exposes the first output pads.

13. The display apparatus of claim 12, wherein the first output pads are electrically connected to second output terminals of the driver chip and the third output pads are electrically connected to first output terminals of the driver chip.

14. The display apparatus of claim 1, wherein the first display panel further comprises a first data line group to which a first data signal of the first driving signal is applied, and a first gate line group to which a first gate signal of the first driving signal is applied, and the second display panel further comprises a second data line group to which a second data signal of the second driving signal is applied, and a second gate line group to which a second gate signal of the first driving signal is applied.

15. The display apparatus of claim 14, wherein the driver chip comprises:
a source driving section that applies the first and second data signals to the first and second data line groups in response to a first selection signal and a second selection signal of which phase is opposite to the first selection signal, respectively;
a first gate driving section applying the first gate signals to the first gate line group; and
a second gate driving section applying the second gate signals to the second gate line group.

16. The display apparatus of claim 15, wherein the driver chip further comprises a control section that outputs the first and second selection signals to control the source driving section.

17. The display apparatus of claim 14, wherein the driver chip comprises:
a first source driving section that applies the first data signal to the first data line group;
a second source driving section that applies the second data signal to the second data line group;
a first gate driving section that applies the first gate signal to the first gate line group; and
a second gate driving section that applies the second gate signal to the second gate line group.

18. The display apparatus of claim 14, wherein the first flexible printed circuit comprises a first connection line group that electrically connects the driver chip to the second data line group, and a second connection line group that electrically connects the driver chip to the second gate line group.

19. The display apparatus of claim 14, wherein the input line group includes first and second input lines, the first input lines formed on a same layer as the first gate line group and the second input lines formed on a same layer as the first data line group.

20. The display apparatus of claim 14, wherein the first and second output lines electrically connect the driver chip with the first data line group and the first gate line group of the first display panel.

21. The display apparatus of claim 1, wherein each of the second output lines is disposed between the first output lines.

22. The display apparatus of claim 1, wherein the second output lines are formed above the spaces between the first output lines.

23. The display apparatus of claim 1, wherein the insulation layer comprise recesses in which the second output lines are formed.

24. The display apparatus of claim 1, wherein the first and second output lines are formed above and below the insulating layer in an alternating manner.

25. A display apparatus comprising:
a first display panel that displays a first image in response to a first driving signal;
a second display panel that displays a second image in response to a second driving signal;
a first flexible printed circuit disposed between the first and second display panels to electrically connect the first and second display panels; and
a driver chip that is formed on the first flexible printed circuit, the driver chip applying the first and second driving signals to the first and second display panels, respectively in response to external signals;
first output lines formed on the first display panel;
an insulation layer formed on the first output lines; and
second output lines disposed on the insulating layer, wherein the first output lines extend to first output pads, the second output lines extend to second output pads, and the first output pads are electrically connected to the first flexible printed circuit through third output pads disposed on the first output pads.

26. The display apparatus of claim 25, further comprising a second flexible printed circuit that transfers the external signals to the driver chip.

27. The display apparatus of claim 26, wherein the first display panel comprises a first lower substrate and a first upper substrate that faces the first lower substrate, and the second display panel comprises a second lower substrate and a second upper substrate that faces the second lower substrate.

28. The display apparatus of claim 27, wherein a first end of the first flexible printed circuit is attached to a first connection region formed on the first lower substrate, the first connection region is exposed out of the first upper substrate, a second end of the first flexible printed circuit is attached to a second connection region formed on the second lower substrate, and the second connection region is exposed out of the second upper substrate.

29. The display apparatus of claim 27, wherein the first display panel includes a first data line group electrically connected to the first output lines and a first gate line group that is perpendicular to the first data line group and is electrically connected to the second output lines, and the second display panel includes a second data line group and a second gate line group that is perpendicular to the second data line group.

30. The display apparatus of claim 29, wherein the first flexible printed circuit includes a first connection line group that electrically connects the driver chip to the first output lines, a second connection line group that electrically connects the driver chip to the second output lines, a third connection line group that electrically connects the driver chip to the second data line group, and a fourth connection line group that electrically connects the driver chip to the second gate line group.

* * * * *